United States Patent
Bassi et al.

(10) Patent No.: US 6,227,434 B1
(45) Date of Patent: May 8, 2001

(54) REWORKING OF A BALL GRID ARRAY MODULE

(75) Inventors: Luigi Bassi, Lodi; Michele Monopoli, Milan; Paolo Spinzi, Milan; Danilo Villa, Milan, all of (IT)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/273,788

(22) Filed: Mar. 22, 1999

(30) Foreign Application Priority Data

Apr. 8, 1998 (GB) .................................... 9807407

(51) Int. Cl.[7] .......................... B23K 31/10; B23K 1/018
(52) U.S. Cl. ........................ 228/119; 228/264; 228/22
(58) Field of Search ...................... 228/119, 13, 264, 228/180.22; 219/647; 438/613

(56) References Cited

U.S. PATENT DOCUMENTS

| | | |
|---|---|---|
| 3,359,132 | * 12/1967 | Wittmann . |
| 3,923,002 | 12/1975 | Vanyi . |
| 4,531,986 | * 7/1985 | Barajas ................................ 148/24 |
| 4,635,584 | * 1/1987 | Obermann ............................ 118/64 |
| 5,298,082 | * 3/1994 | Weitz ................................... 134/40 |
| 5,458,281 | 10/1995 | Downing et al. . |
| 5,766,674 | * 6/1998 | Hirosawa . |

OTHER PUBLICATIONS

Lawrence Van Vlack. Elements of Materials Science and Engineering: Sixth Edition. 1990, p. 578.*

* cited by examiner

Primary Examiner—Patrick Ryan
Assistant Examiner—Jonathan Johnson
(74) Attorney, Agent, or Firm—Ire D. Blecker

(57) ABSTRACT

A method for reworking a Ball Grid Array electronic module by removing the solder balls from the substrate surface after one or more of the connections have been detected to be damaged. The module is immersed in a water soluble oil bath and heated to the melting point. Then a rotating brush, with the rotating axis perpendicular to the substrate plane, removes the solder balls and the solder material particles while the module is still immersed in the fluid.

7 Claims, 2 Drawing Sheets

REWORKING OF A BALL GRID ARRAY MODULE

TECHNICAL FIELD

The present invention relates to the removal of the solder connection balls from a substrate during the rework process of electronic packages.

BACKGROUND OF THE INVENTION

A recent development introduced the use of Ball Grid Array (BGA) technique in the manufacturing of electronic modules which can be of the Single Chip Module (SCM) type or Multi Chip Module (MCM) type. These modules are provided with a plurality of conductive pads for electrical connection with electronic circuits (such as mother boards, back planes, application boards). The electrical connection is achieved by little spherical portions of solder alloy which give the name of Ball Grid Array (BGA) to this kind of electronic module.

FIG. 1 is an example of a section of a BGA module of the SCM type. On the lower face of a substrate 101 there is a plurality of conductive pads 103 each pad provided with a solder ball 105 which will be put in contact with an electronic circuit and reflowed, thereby realizing the electrical connection. These solder balls are usually and conveniently made of an eutectic alloy containing Sn (63% by weight) and Pb (37% by weight). This alloy offers the advantage of having a relatively low melting point (183 C), known as eutectic point. On the upper face of the module there is the active element 107. The active element usually needs to be protected against atmospherical agents and against the heat of the reflow cycles. As represented in FIG. 1 the active element can be covered by a molded cap 109. Other methods of protection can be used instead, e.g. an epoxy resin underfiller.

The BGA technology has a number of advantages over the traditional technologies such as Pin Grid Arrays in terms, for example, of reliability, robustness and cost of manufacturing.

The substrates of the BGA modules can be ceramic or, more recently, organic Printed Circuit Board laminates. These last modules are usually called Plastic Ball Grid Arrays. The definition "Plastic" indicates the flexible nature of the PCB as opposed to a ceramic substrate.

During the manufacturing process it may happen that one or more of the connection balls are damaged or lost. Furthermore, once the module has been mounted on the electronic board (second level packaging), the solder balls could be proved not to provide an adequate connection between the module and the circuit board, on which the BGA module has been mounted. In such instance the BGA module must be removed from the board and it is often lost. Considering the increasing costs of the semiconductor devices, it would be obviously desirable to rework and reuse as many modules as possible once they have been found to be damaged.

The modules could be checked and fixed manually, but this activity would be far too laborious and expensive.

In order to re-introduce the reworked module in the manufacturing process, all the solder balls must be completely removed and no traces of solder material should be left on the module surface. It is known to rework ceramic packages by using hot water vapour in order to reflow the solder balls causing detachment from the substrate. However in the case of BGA package with an organic laminate the temperatures cannot be too high, because this would damage the substrate. Another problem is that the solderable surface on the module substrate could be jeopardized by the oxidation caused by the exposure to air. Furthermore the reflowing of the solder balls does not guarantee the detachment of all the solder material.

It is an object of the present invention to provide a technique which alleviates the above drawbacks of the prior art.

SUMMARY OF THE INVENTION

According to the present invention we provide a method for completely removing the solder balls from the substrate of a Ball Grid Array electronic module for further reworking, including the steps of: heating the solder balls until they reach their melting point by immersing the module in a heated water soluble oil bath; while the module is immersed in the water soluble oil bath, engaging the module substrate with at least one rotating brush.

Furthermore, according to the present invention we provide a system for completely removing the solder balls from the substrate of a Ball Grid Array electronic module for further reworking, including: a water soluble oil bath having heating means adapted to heat the oil to a temperature higher than the melting point of the solder balls; support means for immersing the module in the oil bath; at least one rotating brush engaging the module substrate.

BRIEF DESCRIPTION OF THE DRAWING

Various embodiments of the invention will now be described in detail by way of examples, with reference to accompanying figures, where.

DETAILED DESCRIPTION OF THE PREFERRED EMBODIMENT

According to a preferred embodiment of the present invention, the BGA module, to be re-worked, is immersed in a water soluble oil bath heated to a temperature slightly greater than the melting point of the solder alloy balls. According to a preferred embodiment the action of a rotating brush removes the solder balls. The rotation axis of the brush is perpendicular to the surface of the BGA module, so that the brush bristles hit the solder balls from their side, along a direction parallel to the surface. This has been proved to be the best action for overcoming the adhesion force of the small solder material particles with the substrate. In an alternative embodiment of the present invention, a resilient blade is also passed over the substrate surface before the rotating brush, for preparing and facilitating the action of the brush.

Figure 1:
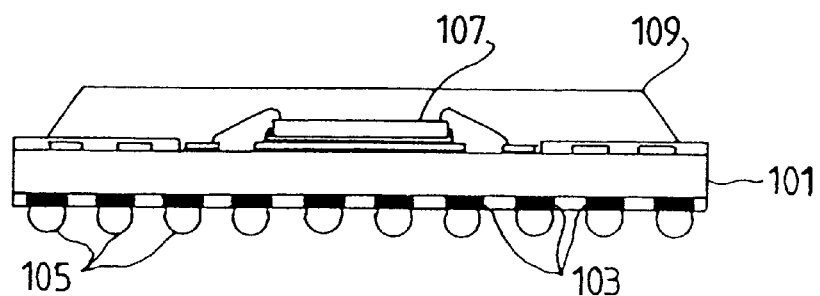
FIG. 1 shows schematically a conventional BGA electronic module to which the present invention is addressed.
Figure 2:
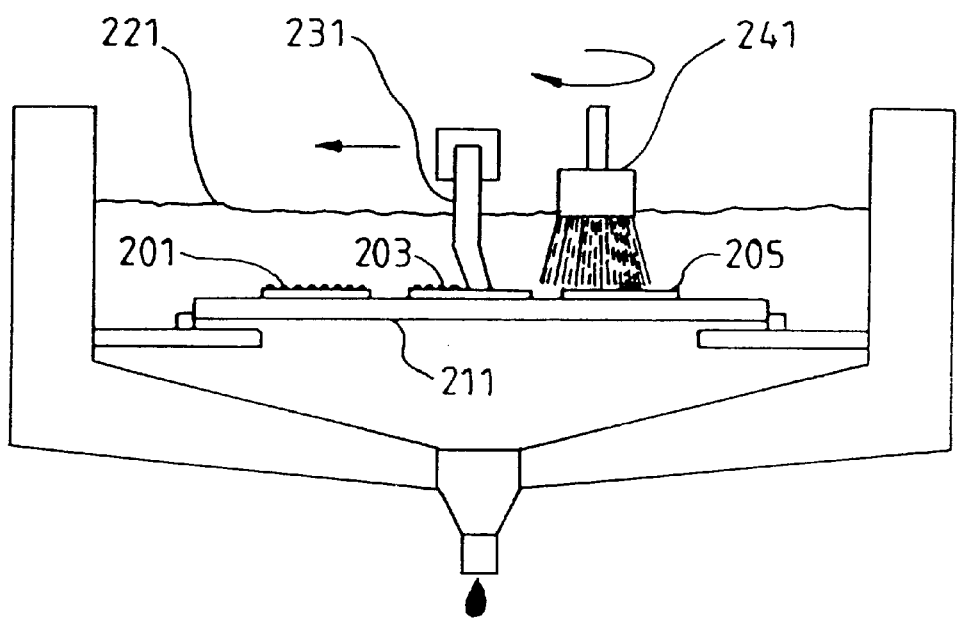
FIG. 2 shows schematically an embodiment of the present invention.

FIG. 2 is a schematic representation of a preferred embodiment of the present invention. The modules 201, 203 and 205 are placed on tray 211 with the ball grid array facing upward. The tray 211 is immersed in water soluble oil 221. The temperature of the oil is high enough to cause the melting of the solder material, but not too high to avoid damaging the substrate and the active device on the other side of the module. The resilient blade 231 passes over the module surface removing the solder balls. Then the action of the rotating brush 241 removes any remaining solder balls and all the solder material particles form the substrate surface. The combined action of the resilient blade 231 and the rotating brush 241, facilitates the detachment of the solder balls and maximises the cleaning effect. The resilient blade removes the big and easiest portion of solder material, leaving the small particles to the action of the brush. However, the brush alone could be enough to remove all the particles.

The fluid in which the tray 211 is immersed has the function of heating the solder joints to a temperature where they are easily removed by the brush and, optionally, the blade. Typically the solder balls used in BGA technology are made of an eutectic tin-lead (Sn-Pb) composition; more precisely 67% (by weight) of Sn and 37% (by weight) of Pb. The temperature at which eutectic solder balls begin to melt is 183 C. The fluid 221 is conveniently heated at a temperature of about 200 C. It should be understood, however, that other solder compositions could be used for the solder balls and these other solder compositions may have a melting range higher or lower than 183 C. In the case of these other solder compositions, the fluid 221 would have to be heated to an appropriate temperature so as to cause melting of the solder balls.

According to a preferred embodiment of the present invention, the modules to be reworked are put on a tray 211; the tray is ideally kept for a few seconds (less than 10 sec) close to the heated oil 221 before being immersed in it. This is to pre-heat the electronic modules for avoiding any thermal shock effect. According to a preferred embodiment of the present invention the distance at which the module is kept from the oil is between 1 and 5 mm.

The relatively low temperature of the heating fluid, while enough to melt the eutectic or other solder alloy, guarantees that the substrate and the active device, with its resin protection, are not damaged by the heat.

Since the modules are completely immersed in a fluid, there is no contact between the modules and the air during the heating phase. This is particularly important for the metallic pads and the metallized circuits, which could be oxidised by the contact with oxygen. The oxidation can give problems in the soldering of the new balls. For this reason the use of overheated aqueous vapour would not be recommended as a heating fluid.

The oil, used as heating carrier, also has the advantage of being stable at the high temperatures and of having a high flash point (i.e. the temperature at which a material can burst into flame), so that it can be used without particular precautions. The choice of a water soluble oil, instead of a state of the art synthetic oil, offers the additional advantage of being completely biodegradable, with obvious benefits for the environment. The modules immersed in the soluble oil, after being brushed, need only to be washed in de-mineralised water, while a state of the art synthetic oil would require a more complex cleaning process with dangerous solvent solutions. According to a preferred embodiment of the present invention the soluble oil used is Hollis 600 produced by Chevron Inc. Hollis 600 includes water soluble polyglycol ether, polyamide dispersant and antioxidant.

In a preferred embodiment of the present invention the brush is a round rotating brush having an annulus of bristles and being empty in the middle. This maximizes the effect of the centrifugal force. The bristles are preferentially made of stainless steel, which provides a good elasticity and does not allow the tin-lead particles to adhere. The harmful ESD (electrical static discharge) effect is not an issue, since the friction between the brush and the substrate occurs in immersion. The number of brushes employed can vary according to the dimension of the tray and the number of modules to be re-worked.

Figure 3A:
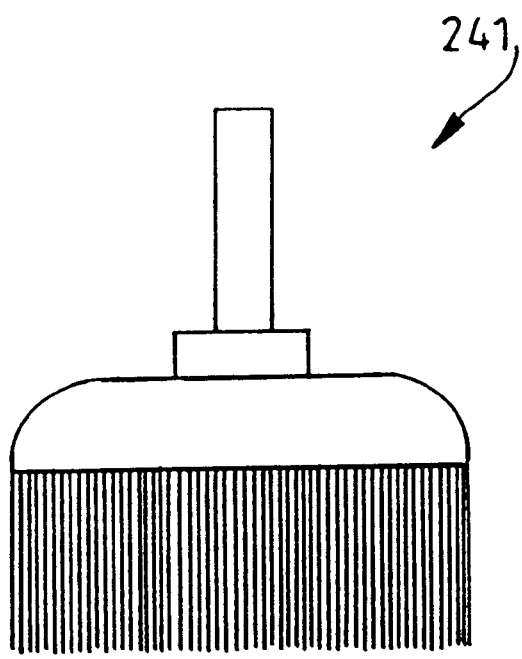
FIG. 3A shows a brush according to a preferred embodiment of the present invention and FIG. 3B shows the bristle annulus of the brush.
Figure 3B:
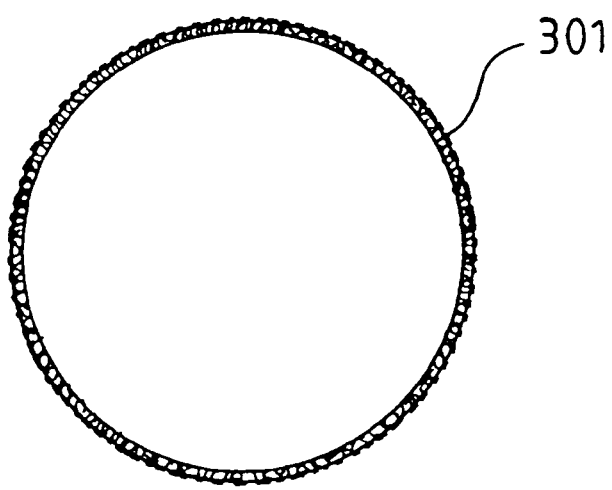

In FIG. 3A a round brush 241, according to a preferred embodiment of the present invention, is shown. In a particular embodiment as shown in FIG. 3B, the outside diameter of the bristle annulus 301 is 50 mm, the bristle annulus thickness is 4 mm, the bristle diameter 0.1 mm and the bristle length is 20 mm. Of course, different dimensions could also work well. It is believed that a time of 90 seconds should be enough for the heating of the solder balls and their removal by means of the brush. As mentioned above an optional resilient blade can be passed over the solder balls before the rotating brush. In a preferred embodiment the blade is made of a rubber material (e.g. VITON, a fluoroelastomer produced by Du Pont). In a preferred embodiment the resilient blade and the brush perform their action by moving over the tray 211. Those skilled in the art will easily appreciate that many other solutions and combinations can also work well. For example, it would be equivalent if the tray moved and the brush was fastened.

What is claimed is:

1. A method for completely removing the solder balls from the substrate of a Ball Grid Array electronic module for further reworking, including the steps of:

heating the solder balls until they begin to melt by immersing the module in a heated water soluble oil bath;

passing a resilient blade over the module substrate to remove the melted solder balls; and engaging the module substrate with at least one rotatable brush that is rotating and engaging the module substrate while the module substrate is immersed in the water soluble oil bath.

2. The method of claim 1 wherein the brush has a rotating axis perpendicular to the plane of the substrate.

3. The method of claim 1 further comprising the step of:

pre-heating the solder balls by keeping the module close to the heated oil before immersion.

4. A system for completely removing the solder balls from the substrate of a Ball Grid Array electronic module for further reworking, including;

a water soluble oil bath having heating means adapted to heat the oil to a temperature high enough to cause melting of the solder balls;

support means for immersing the module substrate in the oil bath;

a resilient blade for passing over the module substrate; and at least one rotating brush for engaging the module substrate after the resilient blade passes over the module substrate, said rotating brush rotating and engaging the module substrate while the module substrate is immersed in the oil bath.

5. The system of claim 4 wherein the at least one rotating brush has a rotating axis perpendicular to the plane of the substrate.

6. The system of claim 4 wherein the at least one rotating brush has stainless steel bristles.

7. The system of claim 4 wherein the bristles of the at least one rotating brush form an annulus along the edges of the brush.

* * * * *